US012610493B2

(12) United States Patent
Brazeau et al.

(10) Patent No.: US 12,610,493 B2
(45) Date of Patent: Apr. 21, 2026

(54) INVERTER WITH CURRENT SENSOR AND ELECTROMAGNETIC INTERFERENCE (EMI) FILTER

(71) Applicant: DANA TM4 INC., Boucherville (CA)

(72) Inventors: Michel Brazeau, Delson (CA);
Francois Dube, Montreal (CA);
Maxime Caron, Montreal (CA);
Michel Tulane, Saint-Hubert (CA);
Cristian Campean, Saint-Hubert (CA)

(73) Assignee: DANA TM4 INC., Boucherville (CA)

( * ) Notice: Subject to any disclaimer, the term of this patent is extended or adjusted under 35 U.S.C. 154(b) by 356 days.

(21) Appl. No.: 18/347,326

(22) Filed: Jul. 5, 2023

(65) Prior Publication Data

US 2024/0015916 A1     Jan. 11, 2024

Related U.S. Application Data

(60) Provisional application No. 63/367,779, filed on Jul. 6, 2022.

(51) Int. Cl.
| | |
|---|---|
| *H05K 7/14* | (2006.01) |
| *H02M 1/44* | (2007.01) |
| *H02M 7/00* | (2006.01) |
| *H05K 7/20* | (2006.01) |

(52) U.S. Cl.
CPC .......... *H05K 7/14329* (2022.08); *H02M 1/44* (2013.01); *H02M 7/003* (2013.01); *H05K 7/20927* (2013.01)

(58) Field of Classification Search
CPC .. H05K 7/14329; H05K 7/20; H05K 7/20218; H05K 7/20263; H05K 7/20927; H05K 7/2089; H02M 1/44; H01M 7/003
USPC ......................... 361/775–778, 803; 439/76.2
See application file for complete search history.

(56) References Cited

U.S. PATENT DOCUMENTS

| | | | | |
|---|---|---|---|---|
| 7,016,192 B2 * | 3/2006 | Beihoff | ................... | B60L 50/50 |
| | | | | 361/689 |
| 9,680,385 B2 * | 6/2017 | Pietrantonio | ...... | H05K 7/20927 |
| 2014/0197532 A1 * | 7/2014 | Ide | .......................... | H01L 23/42 |
| | | | | 257/706 |
| 2016/0365788 A1 * | 12/2016 | Singh | .................... | B60L 15/007 |
| 2017/0063203 A1 * | 3/2017 | Doo | ........................ | B60L 50/00 |
| 2021/0344258 A1 * | 11/2021 | Singh | .................... | H02K 7/006 |
| 2022/0095493 A1 * | 3/2022 | Blanchard St-Jacques | ................ | |
| | | | | H05K 1/0231 |

OTHER PUBLICATIONS

Brazeau, M. et al., "Inverter With Housing Chambers for Electromagnetic Interference (EMI) Reduction," Filed Sep. 21, 2022, 24 pages.

* cited by examiner

*Primary Examiner* — Tuan T Dinh
(74) *Attorney, Agent, or Firm* — McCoy Russell LLP

(57) ABSTRACT
An inverter is provided herein. The inverter includes, in one example, a direct current (DC) bus bar assembly electrically connected to a capacitor and a current sensor and an electromagnetic interference (EMI) filtering capacitor on a circuit board. The inverter further includes a power module electrically coupled to the capacitor and an alternating current (AC) bus bar assembly, where the AC bus bar assembly includes multiple phase bus bars.

18 Claims, 4 Drawing Sheets

INVERTER WITH CURRENT SENSOR AND ELECTROMAGNETIC INTERFERENCE (EMI) FILTER

CROSS-REFERENCE TO RELATED APPLICATION

The present application claims priority to U.S. Provisional Application No. 63/367,779, entitled "INVERTER WITH CURRENT SENSOR AND ELECTROMAGNETIC INTERFERENCE (EMI) FILTER," and filed on Jul. 6, 2022. The entire contents of the above-listed application are hereby incorporated by reference for all purposes.

TECHNICAL FIELD

The present disclosure relates to an inverter designed with a current sensor and a filter that reduce electromagnetic interference (EMI) within the inverter.

BACKGROUND AND SUMMARY

Inverters are used in a variety of fields to change direct current (DC) to alternate current (AC). Inverters are used in a variety of fields such as electric vehicles, solar power installations, industrial equipment, and the like. Inverters use power modules that switch at high frequencies to enable the DC to AC conversion functionality.

US 2017/0063203 A1 to Doo discloses a power inverter assembly with power modules coupled to DC capacitors and an AC bus bar. Doo's inverter assembly generally includes an outer housing that is designed to reduce electromagnetic interference (EMI) escaping the inverter.

The inventors have recognized several drawbacks with Doo's inverter as well as other prior inverters. For instance, the power modules in Doo's inverter may cause undesirable EMI with the DC bus sub-assembly as well as the gate drive circuit board. Consequently, the inverter's performance is degraded. Further, previous inverters have exhibited space and manufacturing inefficiencies. These space inefficiencies impose undesirable spatial constraints on surrounding components, thereby reducing the inverter's applicability.

The inventors have recognized the aforementioned challenges and developed an inverter to at least partially overcome the challenges. The inverter includes, in one example, a DC bus bar assembly electrically connected to a capacitor. The inverter further includes a current sensor and an EMI filtering capacitor on a circuit board. The inverter further includes a power module electrically coupled to a capacitor and an AC bus bar assembly. In the inverter, the AC bus bar assembly includes multiple phase bus bars. Designing an inverter with these features allows the inverter to achieve greater compactness and increases manufacturing efficiency, if desired. The inverter's applicability and customer appeal is consequently increased.

In one example, the circuit board may be an EMI filtering and current sensing circuit board that is coupled to DC bus bars in the DC bus bar assembly. Positioning the current sensor in the EMI filtering and current sensing circuit board allows the current reading to be simplified, thereby decreasing the amount of processing resources demanded for current signal processing, if so desired.

Further in one example, the AC bus bar assembly may include multiple current sensor shields, AC bus bars, and a ferrite EMI filter positioned in a polymer molding. Arranging these components in the polymer molding allows the inverter to be more efficiently assembled as well as achieve even greater compactness.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

Figures 1, 2:
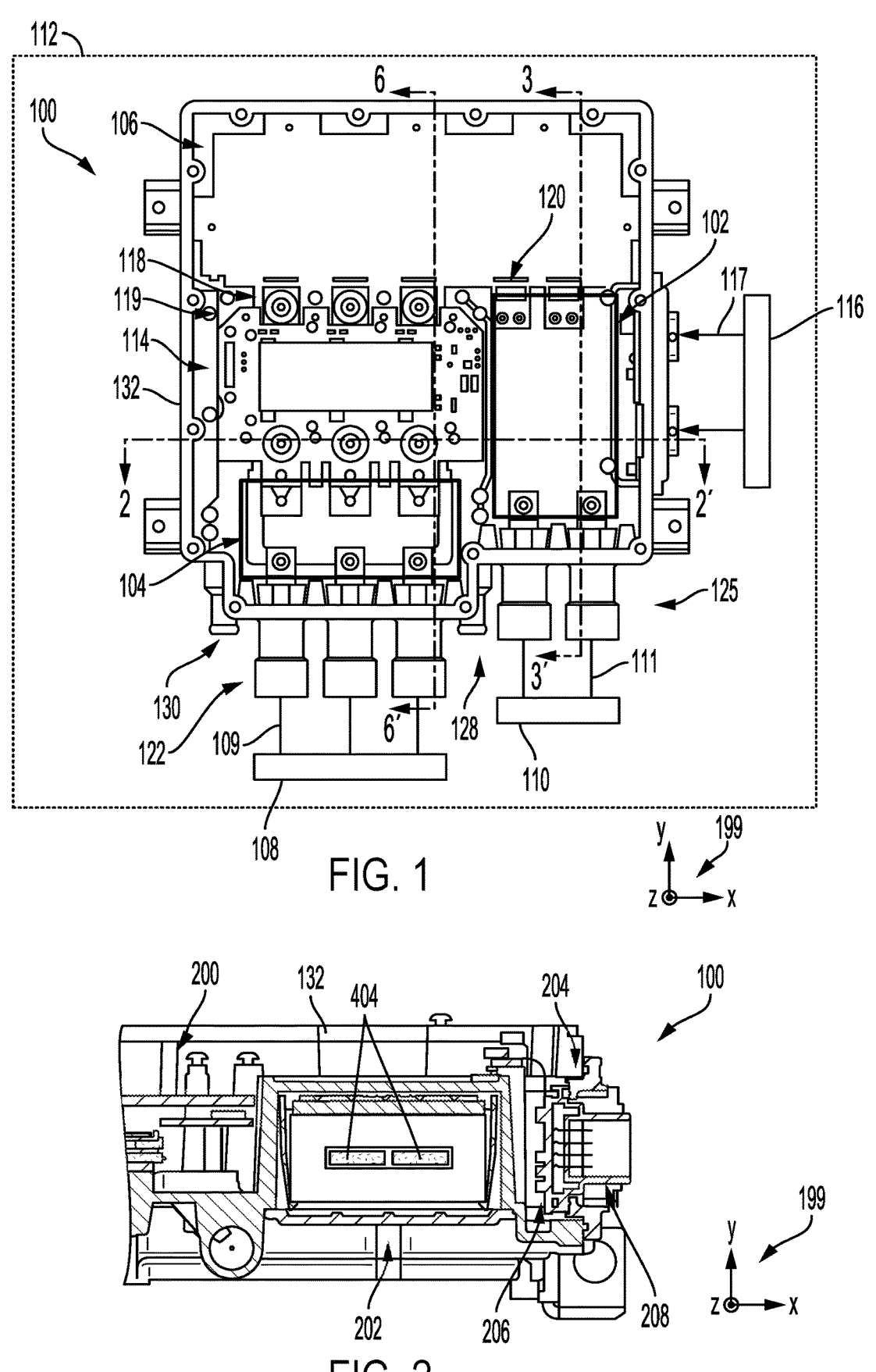
FIG. 1 is an illustration of system with an inverter.
FIG. 2 is a cross-sectional view of the inverter, depicted in FIG. 1, with the cross-section extending through multiple chambers in the housing.

FIG. 1 depicts an inverter 100 that is designed to convert direct current (DC) to alternating current (AC). To achieve this functionality, the inverter 100 includes a DC bus bar assembly 102 and an AC bus bar assembly 104 which are both electrically connected to a capacitor 106 either directly or indirectly. To form the internal electrical connections in the inverter described herein conductive plates, harnesses, capacitors, cables, combinations thereof, and the like may be used to establish these connections. Similarly, cables, harnesses, combinations thereof, and/or other suitable components for establishing electrical connections may be used to electrically couple the inverter to external components. However, cables, under some operating conditions, function as antennas which pick up electromagnetic interference (EMI) noise. Therefore, use of extraneous cables within the inverter may be avoided to diminish internal EMI.

The inverter 100 may be coupled to an AC electrical component 108 (e.g., a traction motor in an electric vehicle (EV) embodiment) and a DC electrical component 110 (e.g., a vehicle energy storage system such as one or more traction batteries, capacitors, fuel cells, and the like, in the EV embodiment). Cables 109 and 111 and/or other suitable electrically conductive components are used to electrically couple the AC electrical component 108 and the DC electrical component 110 to the inverter 100. In one example, the inverter 100 may be included in an EV 112 or other suitable electric system and may be referred to as a power electronics unit, in the EV example. In such an example, the inverter adjusts the speed of a traction motor in the vehicle.

The EV 112 may be a light, medium, or heavy duty vehicle. In such an example, the AC electrical component 108 may be a traction motor and the DC electrical component 110 may be a traction battery. However, it will be understood that the inverter may be included in a variety of environments. For example, the inverter 100 may be included in a solar power installation, an industrial machine, and the like.

Further, the inverter 100 may include a power (e.g., gate-driver) printed circuit board assembly (PCBA) 114 that is designed to control the power distributed by the inverter 100. For instance, in the EV example, the power PCBA 114 adjusts the amount of power supplied to the traction motor to alter the motor's speed. To elaborate, the power PCBA may translate the logic-level signals from the control PCBA to drive the power module gate signals with appropriate gate voltage levels. Duty cycles of the power module switches may be adjusted to produce the desired phase voltage and currents at the inverter output which may then be converted to mechanical torque by the motor (e.g., the traction motor). However, as indicated above the inverter may be used in a variety of operating environments. The power PCBA 114 and the other circuit boards described herein may include one or more microprocessors, memory, and the like to achieve the power adjustment functionality. A control PCBA 310, shown in FIG. 3, may receive electrical energy from a power supply 116 as indicated via arrows 117. This electrical energy may have a lower voltage than the electrical energy flowing into and out of the inverter. As such, the power supply may be referred to as a lower voltage power supply, in one example.

As illustrated in FIG. 1, the capacitor 106 is electrically coupled to a power module 119 (e.g., a power transistor module) via an electrical interface 118 (e.g., a DC bus bar interface). The power module 119 is configured to switch at a target frequency to allow for the DC to AC conversion.

The electrical interface 120 between the DC bus bar assembly 102 and the capacitor 106 is further depicted in FIG. 1. Further, electrical connectors 122 that facilitates efficient electrical coupling between phase bus bars in the AC bus bar assembly 104 and the AC electrical component 108 are additionally illustrated in FIG. 1. DC input connectors 125 that facilitate efficient electrical coupling between DC bus bars in the DC bus bar assembly 102 and the DC electrical component 110 (e.g., the vehicle's energy storage system, as indicated above) are further illustrated in FIG. 1. However, other suitable DC connector architectures may be used, in other examples.

In the illustrated example, a coolant inlet 128 and a coolant outlet 130 are further included in the inverter 100. A housing 132 may include coolant conduits through which the coolant circulates and removes heat from the inverter 100. Cooling system components may be hydraulically coupled to the coolant inlet and outlet such as one or more pumps, a heat exchanger, a filter, and the like. The coolant may include water, glycol, combinations thereof, and the like. However, other suitable cooling system designs may be used in alternate examples.

Figure 3:
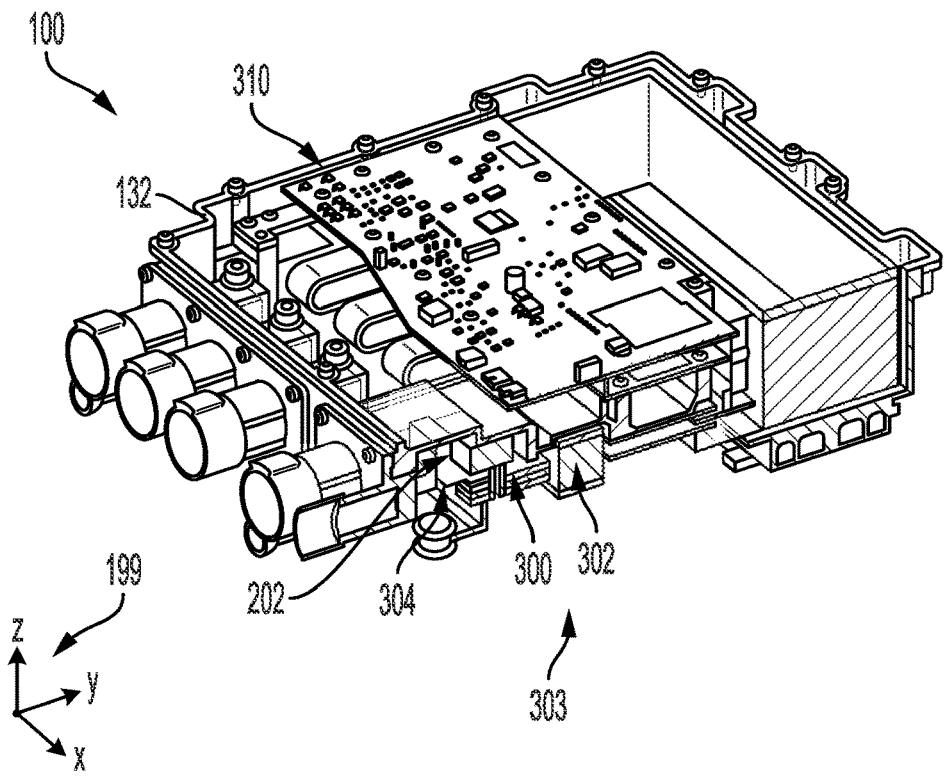
FIG. 3 is a cross-sectional view of the inverter, depicted in FIG. 1, with the cross-section extending through a direct current (DC) bus bar assembly.
Figure 4:
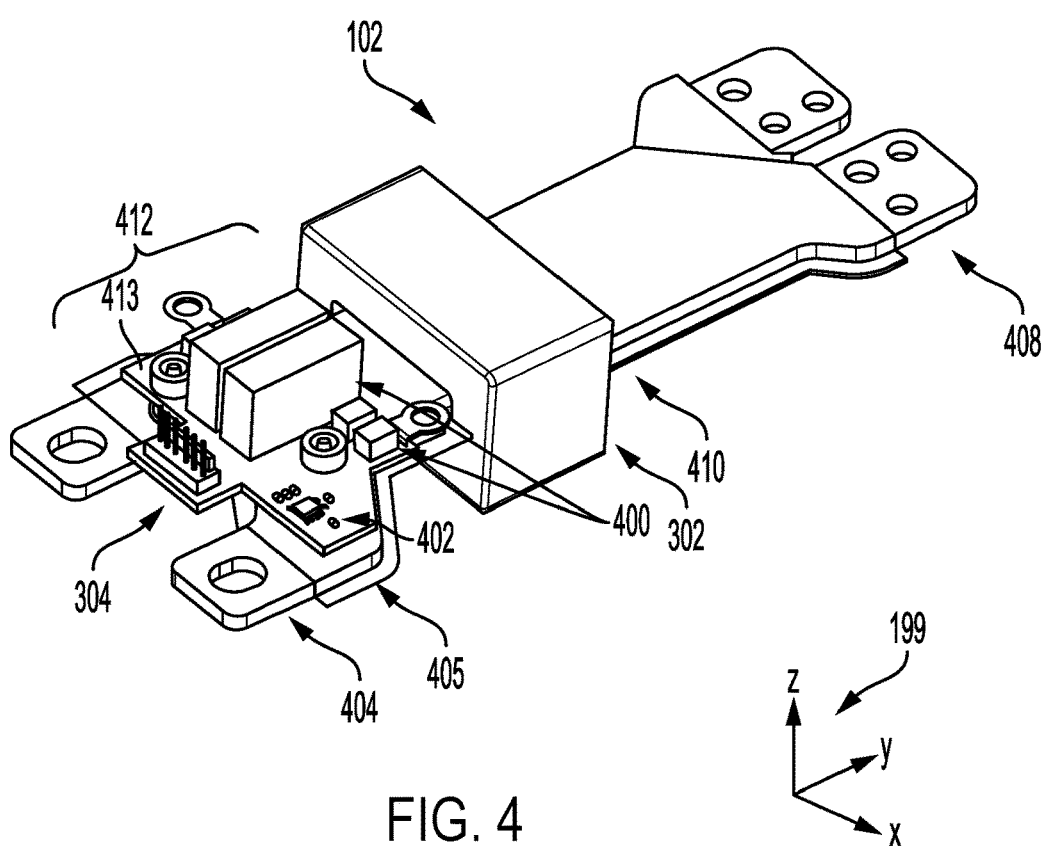
FIG. 4 is a detailed perspective view of the DC bus bar assembly in the inverter, depicted in FIG. 1.
Figures 5, 6:
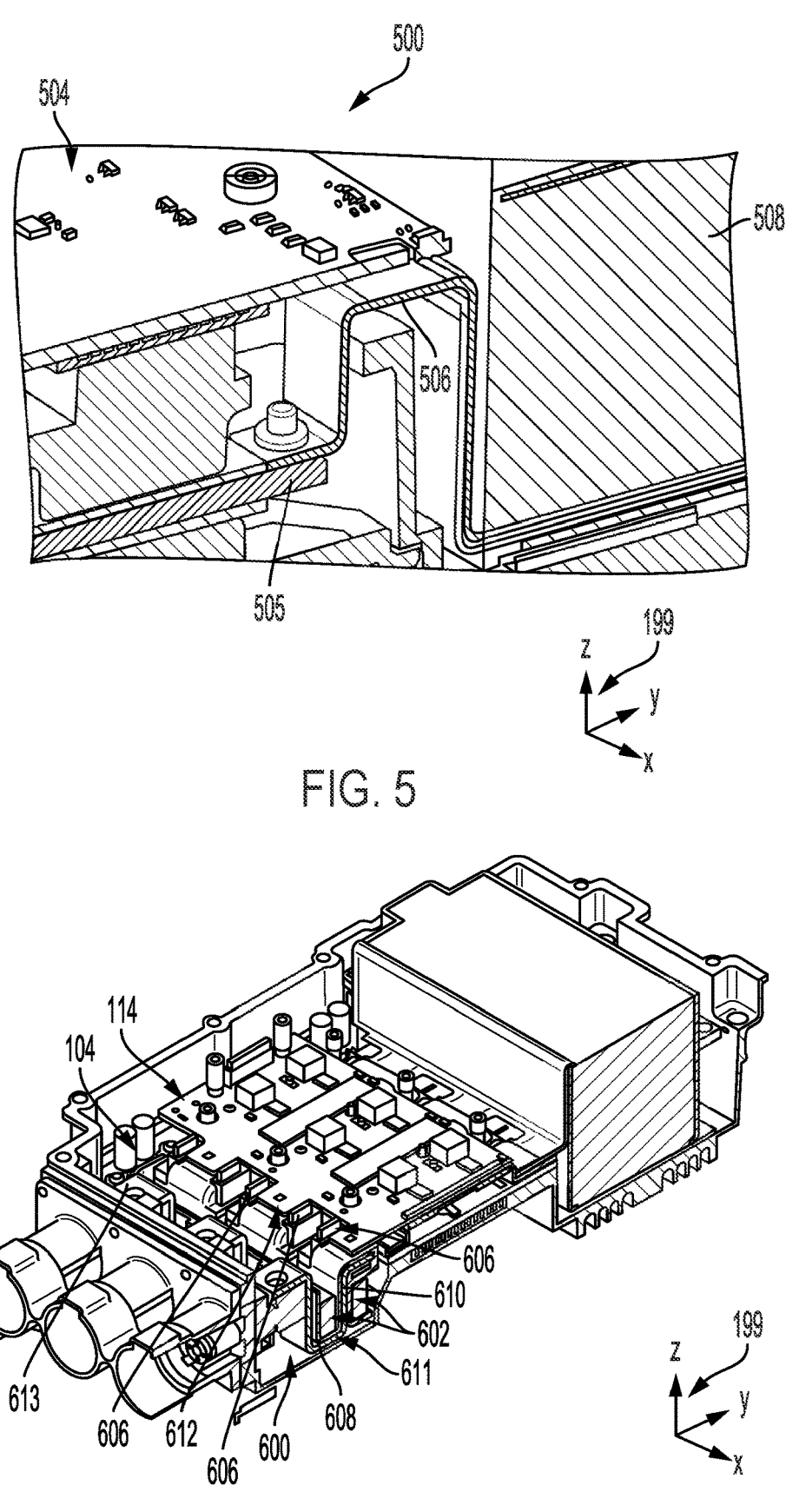
FIG. 5 is a detailed perspective view of another example of an inverter with a printed circuit board near a capacitor.
FIG. 6 is a cross-sectional view of the inverter, depicted in FIG. 1, with the cross-section extending through an alternating current (AC) bus bar assembly.

An axis system 199 is provided in FIG. 1 as well as FIGS. 2-8, for reference. The z-axis may be a vertical axis (e.g., parallel to a gravitational axis), the x-axis may be a lateral axis (e.g., horizontal axis), and/or the y-axis may be a longitudinal axis, in one example. However, the axes may have other orientations, in other examples. Cutting planes 2-2', 3-3', and 6-6' indicating the locations of the cross-sectional views depicted in FIGS. 2, 3, and 6 are provided for reference.

FIG. 2 shows a cross-sectional view of the inverter 100. The inverter 100 in the illustrated example, include multiple chambers within the housing 132. These chambers may include a phase-control chamber 200, a DC chamber 202, and a low voltage (LV) chamber 204. Partitioning the housing into these chambers enables EMI to be reduced thereby increasing inverter compliance to electromagnetic emissions targets. To elaborate, partitioning the inverter into the aforementioned chambers allows components with similar amounts of EMI to be grouped together to decrease the chance of the EMI generated by those components interfering with components that generate less EMI, for instance. Consequently, inverter operation may be enhanced.

The phase-control chamber 200 contains (e.g., fully encloses) the power PCBA 114, the AC bus bar assembly 104 depicted in FIG. 1, and partially encloses a control PCBA 310, shown in FIG. 3. Further, the DC chamber 202 contains the DC bus bar assembly 102 depicted in FIG. 1, and the LV chamber 204 may contain LV communication components (e.g., a communication circuit board 206, connectors 208, and the like) designed to interface with components external to the inverter. The phase-control chamber 200 may have greater noise than the DC chamber. Additionally, the LV chamber may have less noise than the DC chamber. In this way, the LV chamber is designed to protect the LV signals from the noise present in the phase-control chamber. The inverter's performance may be increased as a result. In other examples, the inverter may package the components in another suitable manner. FIG. 2 further shows DC bus bars 404.

FIG. 3 shows a cross-sectional view of the inverter 100 with internal features of the DC bus bar assembly 102 revealed. The AC bus bar assembly 104 and the capacitor 106 are again depicted. The control PCBA 310 is further illustrated in FIG. 3. The control PCBA 310 is designed to alter an amount of electric power distributed from the power electronics unit to the external AC electrical component 108 (e.g., the traction motor).

The DC bus bar assembly 102 may include an entry cavity 300 and a ferrite filter 302. The entry cavity 300 may contain an EMI PCB assembly 303. In the illustrated example, the EMI PCB assembly 303 includes EMI filtering capacitors 400, a current sensor 402 shown in FIG. 3, and an electrical connector 304 that is designed to electrically connect to the power PCBA 114, shown in FIG. 1. However, other layouts of the DC bus bar assembly have been contemplated. The DC bus bar assembly 102 is positioned in the DC chamber 202 of the housing 132, as previously discussed. However, in alternate examples, the DC chamber and the LV chamber may form a single chamber or the housing may forgo chamber partitioning.

FIG. 4 shows a detailed view of the DC bus bar assembly 102 with DC bus bars 404 which include holes or other suitable features that enable the DC bus bars to function as an electrical input interface (e.g., bolted electrical input interface) to the DC input connectors 125, shown in FIG. 1. The DC bus bar assembly 102 further includes an electrical output interface 408 (e.g., bolted electrical output interface) that is coupled to the capacitor 106, shown in FIG. 1, when assembled. The electrical output interface 408 includes tabs with openings to enable a robust electrical connection to be established. The DC bus bars 404 and the other bus bars described herein may be constructed out of a suitable conductive material such as copper, aluminum, brass, combinations thereof, and the like. The DC bus bars 404 includes sections 405 that may extend below an EMI filtering and current sensing circuit board 412, discussed in greater detail herein.

In the illustrated example, the ferrite filter 302 is included in the DC bus bar assembly 102. The ferrite filter 302 is designed to reduce EMI noise exiting the inverter, towards the DC electrical component 110, shown in FIG. 1. Specifically, in the illustrated example, the ferrite filter 302 extends around a body of the assembly at a mid-portion 410 thereof. However, in other examples, the ferrite filter may have a different contour (e.g., positioned on an upper or lower side of the body of the bus bar assembly) and/or may be placed in a different location along the bus bar assembly. Still further in other examples, the ferrite filter 302 may be omitted from the DC bus bar assembly. The ferrite filter 302 may specifically be a common-mode filter which selectively removes noise in a targeted frequency range while allows signals in another frequency to pass, in one example. In this way, the DC bus bar assembly may precisely filter out undesirable noise.

The DC bus bar assembly 102 further includes the EMI filtering and current sensing circuit board 412. In the illustrated example, the EMI filtering and current sensing circuit 412 includes the EMI filtering capacitors 400, the current sensor 402 (e.g., hall effect sensor), and the connector 304 (e.g., the signal harness). The current sensor 402 senses the DC flowing through the DC bus bars 404. The current sensor 402 may be a hall effect sensor which reliably senses the amount of DC flowing through the bus bar.

The connector 304 sends signals to the control PCBA 310, shown in FIG. 3. Wires may be used to send the signals between the connector 304 and the control PCBA 310. The EMI filtering capacitors 400 decrease the amount of EMI noise coming out of the inverter towards the external DC electrical component 110 (towards the vehicle high-voltage power distribution system). The EMI filtering and current sensing circuit board 412 may include a substrate 413 on which various components are mounted such as the EMI filtering capacitors 400, the electrical connector 304, and/or the current sensor 402. In this way, the components may be space efficiently incorporated into the DC bus bar assembly.

The EMI filtering and current sensing circuit board 412 with the sensing and filtering components may be positioned between the DC bus bars 404 and the ferrite filter 302, in relation to the y-axis. In this way, the circuitry on the board may be protected from EMI, thereby increasing inverter performance in comparison to inverters without the EMI filtering features described herein.

Further, positioning the EMI filtering and current sensing circuit board 412 near the input connectors 406 allows the current sensor to have closer proximity to the DC bus bars 404 than other locations, such as near the rear of the DC bus bar assembly 102. In this way, the current sensor reading may be simplified which enables the signal to be processed using less processing resources, if wanted.

It will also be appreciated that a field concentrator may be omitted from the inverter due to the placement of the EMI filtering and current sensing circuit board 412 near the input connectors 406 (e.g., near the front of the DC bus bar assembly 102), if wanted. When the field concentrator is omitted, the DC current sensor signal may be filtered and compensated to remove the AC components from the signal. The DC current signal processing may contain one or more of the following processing strategies: offset calibration; gain calibration; low-pass filtering; and external field cancellation (e.g., the removal of influence from nearby conductors such as the AC bus bars).

FIG. 5 shows another example of an inverter 500. The inverter 500 may have a similar design with regard to at least a portion of the components in the inverter 100, shown in

6

FIG. 1. Redundant description of the overlapping components is omitted for brevity. However, the inverter 100 depicted in FIG. 5 may have a current sensor positioned on a control PCBA 504 as opposed to the EMI filtering and current sensing circuit board. The current sensor may generate a current reading of the current flowing through a connector 506 which electrically couples the DC bus bars 505 to a capacitor 508. Field concentrators may also be forgone in the inverter 500 shown in FIG. 5, to simplify inverter construction and increase the inverter's space efficiency.

Positioning the current sensor on the control PCBA 504 allows the signal path to the microprocessor (which may also be located on the control PCBA) to be reduced, if desired. Further, positioning the current sensor on the control PCBA 504 also allows the use of a connector and harness system in the signal path to be avoided, if so desired. However, in other examples, the current sensor may be positioned in another suitable location, such as on the DC bus bar as discussed above with regard to FIG. 4 in one example, or the current sensor may be omitted from inverter in another example.

FIG. 6 shows a cross-sectional view of the AC bus bar assembly 104 and the capacitor 106 in the inverter 100 along with the power PCBA 114. In the illustrated example, the AC bus bar assembly 104 includes multi-phase bus bars 600, a ferrite filter 602, and current sensor shields 606 which are all incorporated into a plastic support 608. The plastic support 608 functions to retain these components in a single structure for simplified installation. The plastic support 608 further enables a section 610 of the phase bus bars 600 to be arranged between the ferrite filter 602 to reduce the amount of undesirable EMI noise which exits the inverter toward the external AC electrical component 108, shown in FIG. 1. The phase bus bar 600 further includes a section 611 that extends under (with regard to the z-axis) the plastic support 608. Section 611 provide a thermal interface to the cooling surface under the multi-phase bus bars 600. Further, the multi-phase bus bars 600 are connected to AC outlet connectors 613.

The current sensor shields 606 are positioned around the AC current sensors 612 on power PCBA 114. In this way, phase-to-phase interference, also referred to as cross-talk, in the inverter is reduced.

Figures 7, 8:
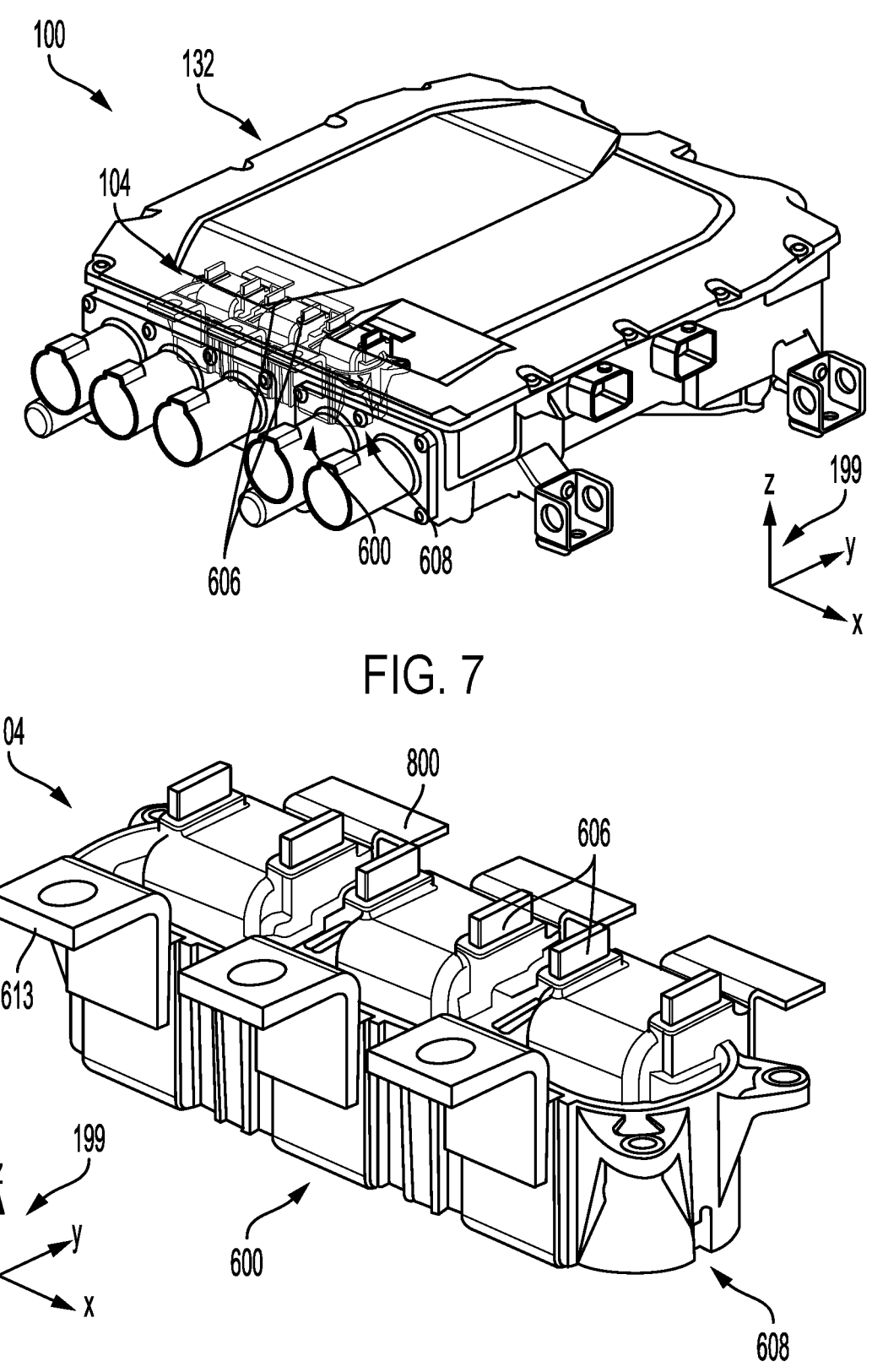
FIG. 7 is a perspective view of the AC bus bars within a housing of the inverter, depicted in FIG. 1.
FIG. 8 is a detailed perspective view of the AC bus bar assembly, depicted in FIG. 7.

FIG. 7 shows the AC bus bar assembly 104 enclosed within the housing 132. The AC bus bar assembly includes, the phase bus bars 600, current sensor shields 606, and the ferrite filter which is obscured from view by a plastic molding 608. These components form a continuous unit that allows for simplified construction of the inverter 100.

FIG. 8 shows a detailed view of the AC bus bar assembly 104. The phase bus bars 600, the current shields 606, and the plastic molding 608 are again illustrated. The plastic molding 608 may be specifically at least partially enclosed the phase bus bars 600 and/or the current shields 606. Further, ferrite filters may be at least partially enclosed in the plastic molding. To elaborate, the ferrite filters may be positioned in front of and behind sections of the phase bus bars, to reduce EMI. The plastic molding allows the inverter to be more efficiently constructed. The AC outlet connectors 613 and connectors 800 profiled to attach to the power PCBA 114, are further illustrated in FIG. 8.

FIGS. 1-8 are drawn approximately to scale, aside from the components which are schematically represented. Although other relative component dimensions may be used, in other embodiments.

FIGS. 1-8 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Additionally, elements co-axial with one another may be referred to as such, in one example. Further, elements shown intersecting one another may be referred to as intersecting elements or intersecting one another, in at least one example. Further still, an element shown within another element or shown outside of another element may be referred as such, in one example. In other examples, elements offset from one another may be referred to as such.

The invention will be further described in the following paragraphs. In one aspect, an inverter is provided that comprises a direct current (DC) bus bar assembly electrically connected to a capacitor; a current sensor and an electromagnetic interference (EMI) filtering capacitor on a circuit board; and an alternating current (AC) bus bar assembly electrically coupled to the capacitor; wherein the AC bus bar assembly includes a plurality of phase bus bars.

In another aspect, an inverter system is provided that comprises a direct current (DC) bus bar assembly electrically connected to a capacitor and including a current sensor and an electromagnetic interference (EMI) filtering capacitor; a power module electrically coupled to a capacitor and an alternating current (AC) bus bar assembly; and control printed circuit board assembly (PCBA) designed to alter an amount of electric power distributed from the inverter system to an electrical component.

In yet another aspect, a power electronics unit for a traction motor is provided that comprises a direct current (DC) bus bar assembly including an electromagnetic interference (EMI) filtering and current sensing circuit board coupled to a DC bus bar, wherein the DC bus bar is electrically connected to a capacitor; wherein the EMI filtering and current sensing circuit board includes a current sensor and an electromagnetic interference (EMI) filtering capacitor; and a power module electrically coupled to a capacitor and an alternating current (AC) bus bar assembly; wherein the control PCBA is designed to alter an amount of electric power distributed from the inverter system to an electrical component.

In another aspect, a power electronics unit for a traction motor is provided that comprises a direct current (DC) bus bar assembly including an electromagnetic interference (EMI) filtering and current sensing circuit board coupled to a plurality of DC bus bars, wherein the DC bus bar is electrically connected to a capacitor; wherein the EMI filtering and current sensing circuit board includes a current sensor and an EMI filtering capacitor; and a power module electrically coupled to a capacitor and an alternating current (AC) bus bar assembly which is electrically coupled to a control printed circuit board assembly (PCBA); wherein the control PCBA is designed to alter an amount of electric power distributed from the power electronics unit to the traction motor.

In any of the aspects or combinations of the aspects, the EMI filtering and current sensing circuit board may be positioned between input connectors of the DC bus bar and a ferrite filter.

In any of the aspects or combinations of the aspects, the DC bus bar assembly may be included in a chamber separate from the AC bus bar assembly.

In any of the aspects or combinations of the aspects, the circuit board may be an EMI filtering and current sensing circuit board coupled to a DC bus bar in the DC bus bar assembly.

In any of the aspects or combinations of the aspects, the DC bus bar assembly may include a ferrite filter.

In any of the aspects or combinations of the aspects, the EMI filtering capacitor may be positioned closer to a plurality of DC input connectors in the DC bus bar assembly than the ferrite filter.

In any of the aspects or combinations of the aspects, the DC bus bar assembly may further include an EMI printed circuit board (PCB) assembly that includes an electrical connector designed to electrically couple to a control printed circuit board assembly (PCBA).

In any of the aspects or combinations of the aspects, the circuit board may be a control printed circuit board assembly (PCBA).

In any of the aspects or combinations of the aspects, the EMI filtering and current sensing circuit board may be positioned between input connectors of the DC bus bar and a ferrite filter.

In any of the aspects or combinations of the aspects, the DC bus bar assembly may be included in a chamber separate from the AC bus bar assembly.

In any of the aspects or combinations of the aspects, the DC bus bar assembly may include a ferrite filter.

In any of the aspects or combinations of the aspects, the capacitor may be positioned closer to a plurality of DC bus bars in the DC bus bar assembly than the ferrite filter.

In any of the aspects or combinations of the aspects, the current sensor may be a hall effect sensor.

In any of the aspects or combinations of the aspects, the DC bus bar assembly may include a plurality of DC input connectors that are designed electrically coupled to an external energy storage device.

In any of the aspects or combinations of the aspects, the external energy storage device may be a traction battery.

In any of the aspects or combinations of the aspects, the AC bus bar assembly may include a plurality of current sensor shields and a motor phase EMI filter positioned in a polymer molding.

In any of the aspects or combinations of the aspects, the current sensor may be a hall effect sensor.

In any of the aspects or combinations of the aspects, the AC bus bar assembly may include a plurality of current sensor shields, AC bus bars, and a ferrite EMI filter positioned in a polymer molding.

In any of the aspects or combinations of the aspects, the inverter may further include a housing enclosing the DC bus bar assembly, the AC bus bar assembly, and the control PCBA.

In any of the aspects or combinations of the aspects, the polymer molding may be included in a chamber of the housing.

In any of the aspects or combinations of the aspects, the electrical component may be a traction motor in an electric vehicle (EV).

In any of the aspects or combinations of the aspects, the control PCBA may be electrically coupled to a lower voltage power supply.

In any of the aspects or combinations of the aspects, the inverter may be configured to electrically connect to a traction motor.

In another representation, a motor drive controller is provided that includes a hall effect sensor designed to sense a direct current (DC) flowing through DC bus bars, wherein the hall effect sensor is included on a front side of a circuit board adjacent to input connectors, wherein a ferrite filter extends around the DC bus bars rearward of the circuit board.

While various embodiments have been described above, it should be understood that they have been presented by way of example, and not limitation. It will be apparent to persons skilled in the relevant arts that the disclosed subject matter may be embodied in other specific forms without departing from the spirit of the subject matter. The embodiments described above are therefore to be considered in all respects as illustrative, not restrictive. As such, the configurations and routines disclosed herein are exemplary in nature, and that these specific examples are not to be considered in a limiting sense, because numerous variations are possible. For example, the above technology can be applied to a variety of electric systems. The subject matter of the present disclosure includes all novel and non-obvious combinations and sub-combinations of the various systems and configurations, and other features, functions, and/or properties disclosed herein.

As used herein, the term "approximately" is construed to mean plus or minus five percent of the range, unless otherwise specified.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. An inverter comprising:
a direct current (DC) bus bar assembly electrically connected to a capacitor;
a circuit board including a DC current sensor, wherein the circuit board is an electromagnetic interference (EMI)

filtering and a current sensing circuit board coupled to a plurality of DC bus bars in the DC bus bar assembly, and wherein the DC bus bar assembly further includes an EMI printed circuit board (PCB) assembly that includes an electrical connector designed to electrically couple to a control printed circuit board assembly (PCBA); and
a power module electrically coupled to the capacitor and an alternating current (AC) bus bar assembly;
wherein the AC bus bar assembly includes a plurality of phase bus bars.

2. The inverter of claim 1, wherein the DC bus bar assembly includes a ferrite filter.

3. The inverter of claim 1, wherein the DC current sensor is a hall effect sensor.

4. The inverter of claim 1, wherein the inverter is configured to electrically connect to a traction motor.

5. The inverter of claim 1, wherein the DC bus bar assembly includes a plurality of DC input connectors that are configured electrically coupled to a DC electrical component.

6. The inverter of claim 1, wherein the circuit board is a control circuit board arranged in a phase-control chamber.

7. The inverter of claim 1, wherein the AC bus bar assembly includes a plurality of current sensor shields and a motor phase EMI filter positioned in a polymer molding.

8. The inverter of claim 2, wherein the EMI filtering is positioned closer to a plurality of DC input connectors in the DC bus bar assembly than the ferrite filter along a longitudinal axis.

9. An inverter system, comprising:
a direct current (DC) bus bar assembly including a plurality of DC bus bars electrically connected to a capacitor;
a current sensor and an electromagnetic interference (EMI) filtering and a current sensing circuit board coupled to the plurality of DC bus bars; and
a power module electrically coupled to the capacitor and an alternating current (AC) bus bar assembly;
wherein a control printed circuit board assembly (PCBA) is designed to alter an amount of electric power distributed from the inverter system to an electrical component, and wherein the DC bus bar assembly further includes an EMI printed circuit board (PCB) assembly that includes an electrical connector designed to electrically couple to the PCBA; and
wherein the power module is configured to switch at a target frequency.

10. The inverter system of claim 9, wherein the current sensor is a hall effect sensor.

11. The inverter system of claim 9, wherein the AC bus bar assembly includes a plurality of current sensor shields, a plurality of AC bus bars, and a ferrite EMI filter positioned in a polymer molding.

12. The inverter system of claim 9, wherein the electrical component is a traction motor in an electric vehicle (EV).

13. The inverter system of claim 9, wherein the control PCBA is electrically coupled to a lower voltage power supply.

14. The inverter system of claim 11, wherein a housing chamber encloses the DC bus bar assembly.

15. The inverter system of claim 14, wherein the polymer molding is included in the housing chamber.

16. A power electronics unit for a traction motor, comprising:
a direct current (DC) bus bar assembly including an electromagnetic interference (EMI) filtering and a current sensing circuit board coupled to a plurality of DC input bus bars, wherein the DC bus bar assembly is electrically connected to a capacitor and further includes an EMI printed circuit board (PCB) assembly that includes an electrical connector designed to electrically couple to a control printed circuit board assembly (PCBA);

wherein the EMI filtering and current sensing circuit board includes a current sensor and an EMI filtering capacitor; and a power module electrically coupled to a capacitor and an alternating current (AC) bus bar assembly which is electrically coupled to the control PCBA; and wherein the control PCBA is designed to alter an amount of electric power distributed from the power electronics unit to the traction motor.

17. The power electronics unit of claim 16, wherein the EMI filtering and current sensing circuit board is positioned between input connectors of the DC bus bar assembly and a ferrite filter.

18. The power electronics unit of claim 16, wherein the DC bus bar assembly is included in a chamber separate from the AC bus bar assembly.

\* \* \* \* \*